(12) United States Patent
Reitlinger et al.

(10) Patent No.: US 9,576,870 B2
(45) Date of Patent: Feb. 21, 2017

(54) MODULE PACKAGE AND PRODUCTION METHOD

(75) Inventors: Claus Reitlinger, Wolnzach (DE); Frank Rehme, Einhausen (DE); Rudolf Bart, Taufkirchen (DE)

(73) Assignee: EPCOS AG, Munich (DE)

( * ) Notice: Subject to any disclaimer, the term of this patent is extended or adjusted under 35 U.S.C. 154(b) by 79 days.

(21) Appl. No.: 13/809,575

(22) PCT Filed: Jun. 20, 2011

(86) PCT No.: PCT/EP2011/060245
§ 371 (c)(1),
(2), (4) Date: Mar. 21, 2013

(87) PCT Pub. No.: WO2012/007252
PCT Pub. Date: Jan. 19, 2012

(65) Prior Publication Data
US 2013/0168876 A1     Jul. 4, 2013

(30) Foreign Application Priority Data
Jul. 12, 2010     (DE) .................. 10 2010 026 843

(51) Int. Cl.
*H01L 23/28* (2006.01)
*H01L 21/56* (2006.01)
(Continued)

(52) U.S. Cl.
CPC .............. *H01L 23/28* (2013.01); *H01L 21/56* (2013.01); *H01L 21/563* (2013.01);
(Continued)

(58) Field of Classification Search
CPC ...... H01L 21/56; H01L 21/563; H01L 21/565; H01L 23/295; H01L 23/3114; H01L 23/3121; H01L 23/315; H01L 23/3185; H01L 23/28; H01L 2924/00014; H01L 2224/73203; H01L 2924/01004; H01L 2924/01068; H03H 9/0542; H03H 9/059; H03H 9/1064
USPC ....... 257/254, 416, 367, 374, 426, 626, 795, 257/E21.041, E21.55, E21.56, E23.132
See application file for complete search history.

(56) References Cited

U.S. PATENT DOCUMENTS 6,038,136 A     3/2000  Weber
6,054,008 A *   4/2000  Chan et al. ................... 156/247
(Continued)

FOREIGN PATENT DOCUMENTS

EP     0896427        2/1999
EP     1189272 A1     3/2002
(Continued)

*Primary Examiner* — Fernando L Toledo
*Assistant Examiner* — Lawrence-Linh T Nguyen
(74) *Attorney, Agent, or Firm* — McDermott Will & Emery LLP

(57) ABSTRACT

The invention relates to a module package which comprises a module substrate 1, a chip 2, 3 applied using the flip chip process, and an encapsulation layer 8, and to a method for producing same. The chip 2, 3 has component structures on the top side 13, 14 thereof. Said top side 13, 14 faces the module carrier 1, wherein a gap 4, 5 is formed between the top side 13, 14 of the chip and the module carrier 1. A filler is added to the encapsulation layer 8. The encapsulation layer 8 partly fills underneath the chip 2, 3, wherein at most the part of the chip 2, 3, on which no component structures are present, is underfilled, and at a minimum the material of the encapsulation layer 8 completely encloses the sides of the chip 2, 3.

11 Claims, 2 Drawing Sheets

(51) Int. Cl.
  *H01L 23/29* (2006.01)
  *H01L 23/31* (2006.01)
  *H03H 9/05* (2006.01)
  *H03H 9/10* (2006.01)

(52) U.S. Cl.
  CPC .......... *H01L 21/565* (2013.01); *H01L 23/295* (2013.01); *H01L 23/315* (2013.01); *H01L 23/3114* (2013.01); *H01L 23/3121* (2013.01); *H01L 23/3185* (2013.01); *H03H 9/059* (2013.01); *H03H 9/0542* (2013.01); *H03H 9/1064* (2013.01); *H01L 2224/16225* (2013.01); *H01L 2224/16227* (2013.01); *H01L 2224/73203* (2013.01); *H01L 2924/00014* (2013.01); *H01L 2924/01004* (2013.01); *H01L 2924/01068* (2013.01)

(56) References Cited

U.S. PATENT DOCUMENTS

| | | | |
|---|---|---|---|
| 6,642,617 B2 | 11/2003 | Kawai | |
| 2003/0137045 A1* | 7/2003 | Sugaya | H01L 21/56 257/701 |
| 2004/0219887 A1* | 11/2004 | Vakilian | 455/73 |
| 2005/0104685 A1* | 5/2005 | Kuroki | H04B 1/0057 333/133 |
| 2005/0206017 A1 | 9/2005 | Starkston et al. | |
| 2008/0157329 A1 | 7/2008 | Inoue | |
| 2008/0251904 A1* | 10/2008 | Theuss et al. | 257/679 |
| 2009/0256166 A1* | 10/2009 | Koike | H01L 33/501 257/98 |

FOREIGN PATENT DOCUMENTS

| | | | |
|---|---|---|---|
| EP | 1289133 | 3/2003 | |
| EP | 1427032 | 6/2004 | |
| EP | 1492231 | 12/2004 | |
| GB | 2297424 | 7/1996 | |
| JP | 2001332654 A | 11/2001 | |
| JP | EP 1289133 A1 * | 3/2003 | ......... H03H 9/02929 |
| JP | 2003289128 A | 10/2003 | |
| JP | 2004-039945 | 2/2004 | |
| JP | 2006-229632 | 8/2006 | |
| JP | 2007-028172 | 2/2007 | |
| JP | 2008167358 A | 7/2008 | |
| JP | 2008270415 A | 11/2008 | |
| JP | 2009285810 A | 12/2009 | |

* cited by examiner

MODULE PACKAGE AND PRODUCTION METHOD

The invention relates to a module package comprising a chip having sensitive component structures such as, in particular, a SAW filter (surface acoustic wave), and to a production method for a module package according to the invention.

The production of modules and the production of SAW filters used therein currently require two separate process chains. SAW filters and modules have hitherto been produced as separate products. For the case of two filters in one function there exist two-in-one filters. For the case of more than two filters in one function the filters can currently be constructed only with individual filters or with a plurality of two-in-one filters together on a module substrate.

If a chip is applied on a module substrate using the flip-chip method, then a gap arises between the chip and substrate. In the known production methods, said gap has to be sealed prior to molding. For this purpose, by way of example, films are laminated on or an injection or dipping method is used.

Therefore, it is an object of the present invention to unify the two process chains, filter production and module production, to form one process chain.

This object is achieved by means of a module package comprising the features of claim 1. Advantageous configurations of the invention are evident from further claims.

It is proposed to protect, with an encapsulation layer, a chip which has component structures on its top side and the top side of which faces the module carrier, wherein a gap is formed between the chip top side and the module carrier. According to the invention, a filler is admixed with the encapsulation layer and the encapsulation layer is configured in such a way that it partly underfills the chip, wherein as a maximum the part of the chip on which no component structures are situated is underfilled. As a minimum the encapsulation layer terminates virtually flush with the side areas of the chip, such that virtually no underfilling occurs. The underfilled part can be a circumferential edge region on the chip top side carrying the component structures.

The sensitive component structures are situated at the chip top side and therefore in the gap between chip top side and module carrier. As a result of the encapsulation layer that partly underfills the chip, a cavity that protects the component structures remains in said gap after encapsulation. An additional housing for the component structures is thereby obviated. That means that the chip or chips and, if appropriate, further components can be applied to the module carrier without being housed.

Within the meaning of this application, a component structure is understood to be, in particular, a microelectromechanical component and/or electroacoustic component structures operating with acoustic waves, for example a resonator operating with bulk acoustic waves or a transducer operating with surface acoustic waves. Microelectromechanical components can comprise sensors and actuators, which in general are mechanically sensitive or have to remain movable for their function in the encapsulated state.

The gap penetration of the molding material used for the encapsulation layer is predominantly determined by the choice of a filler admixed with the molding material. The gap penetration is determined by the proportion of the filler in the overall material and by the size distribution of the filler grains.

In one embodiment, a proportion of the filler in the overall material of the encapsulation layer of more than 75 percent by mass is chosen, such that the desired low gap penetration of the molding material is established during the production of the encapsulation layer.

The filler distribution can be chosen in such a way that at least one third of the filler grains have a diameter greater than the height of the gap under the flip-chip SAW filters.

A bi- or trimodal size distribution of the filler can be used for setting the desired low gap penetration of the molding material. Fine, medium-sized and coarse particles of the filler are used in the case of the trimodal size distribution. Furthermore, it is also conceivable to use filler distributions with more than three particle sizes.

For underfilling a component, fillers having particularly round particles have often been used hitherto, since they afford a high gap penetration and thus a good flow behavior. However, here a low gap penetration is desired, and so such filler particles which have angular outer surfaces are preferably selected and used. Alternatively, it is also possible to use a filler having round filler particles and to set the desired low gap penetration by means of other features of the filler, e.g. the particle size.

One suitable filler is e.g. silicon oxide.

In one embodiment of the invention, a frame or a supporting structure that makes it possible to narrow the gap described is arranged on the module substrate or the chip itself. In this way, the underfilling of the chip by the encapsulation layer is further restricted, such that the size and/or proportion of the filler particles in the molding compound can be reduced.

In a further embodiment possibility, electrical connections between the module substrate and the chip are produced by bumps. Within the meaning of the invention, bumps are understood to be all electrically conductive structures via which it is possible to produce electrical contacts in a "point-type" fashion during bonding. By means of corresponding positioning of the bumps, the gap between chip and module substrate can be narrowed, such that the encapsulation layer penetrates into said gap to a smaller extent and underfills the chip to a lesser extent. Various types of bumps are conceivable for this purpose, for example solder bumps or stud bumps. The latter are compressed by contact pressure with simultaneous action of ultrasound and are welded to a substrate.

In a further embodiment possibility for the present invention, at least one further component, e.g. an SMD component, which requires no cavity is applied on the module substrate. Here a gap likewise arises between the further component and the module substrate. An SMD component is usually connected to the module substrate by means of solder connections. If said solder connections were not sealed, then moisture could be deposited at the interfaces, which leads to a short circuit. Therefore, the above-described gap in the case of an SMD component is filled with an underfilling compound and thus sealed.

Alternatively, the further SMD component can also be fixed on the module substrate by means of a non-melting connection, for example a conductive adhesive. In this case, the underfilling compound can be dispensed with.

The present invention furthermore relates to a method for producing the module package described above. A method for encapsulating the module is used which allows a particularly uniform pressure distribution to be set in a cavity. This includes so-called compression molding.

A component, e.g. a SAW filter, is applied as a bare chip—bare die—on the module using the flip-chip method. A molding compound, with which a filler is admixed, is subsequently applied to the module over a large area. The molding compound is initially applied in solid form, for example as granules, a tablet or a sheet. The module and molding compound are then introduced into a mold, the molding compound is liquefied and the molding compound is molded into the desired shape by an increase in pressure. The molding compound is subsequently cured to form the encapsulation layer.

According to the invention, in this case the material of the encapsulation layer is selected in such a way that it has a gap penetration that leads to underfilling of the at least one chip in such a way that as a maximum the part of the chip on which no component structures are situated is underfilled, and as a minimum the encapsulation layer terminates virtually flush with the side areas of the chip. The curing of the encapsulation layer is preferably effected thermally. Alternatively, the curing can be effected or initiated by irradiation. During thermal curing, the curing temperature is set in such a way that no phase of excessively low viscosity occurs during molding. Rather, the temperature is adjusted to be low enough that a desired specific minimum viscosity is complied with and the gap penetration does not increase impermissibly. This provides for a particularly uniform distribution of the molding material.

The gap penetration of molding compounds is utilized here in a novel manner. Hitherto, the gap penetration has been utilized for ensuring filling of the component in small gaps. According to the invention, the gap penetration is used in the present invention to rule out the filling of a gap under the SAW filters. For this purpose, a method is chosen which makes possible a uniform pressure distribution in the molding. This is the case for example during compression molding. By keeping the pressure constant, the underfill behavior becomes technically controllable. The advantages of the method are that a separate housing for the filters is avoided. This saves a plurality of processing steps and enables different chips or filters to be placed onto the module carrier alongside one another more densely. This gives rise to further advantages such as higher integration density, saving of module substrate and, if appropriate, a reduction of the height of the module.

The invention is explained in greater detail below on the basis of exemplary embodiments and the associated figures. The figures show various exemplary embodiments of the invention on the basis of schematic illustrations which are not true to scale.

Figure 1:
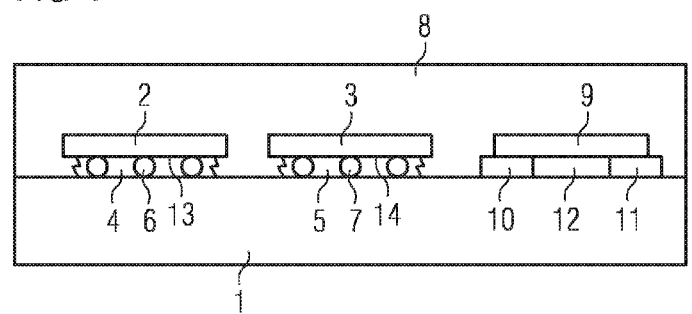
FIG. 1 shows a module package according to the invention comprising two SAW filters and one SMD component in cross section.

FIG. 1 shows a module package according to the invention in cross section. The chips 2, 3, 9 are applied on a module substrate 1. The chips 2, 3 are SAW components having component structures on their top side 13, 14. The top sides 13, 14 of the chips 2 and 3 face the module carrier, wherein a gap 4 and 5, respectively, is formed between chip top side 13, 14 and module carrier. The SAW filters 2, 3 are applied with the module carrier 1 by means of bumps 6, 7 using the flip-chip method. The encapsulation layer 8 is situated above the chips 2, 3. The encapsulation layer 8 has only partly penetrated into the gap 4, 5 between chip 2, 3 and module carrier 1. The encapsulation layer 8 underfills only the edge region of the chip 2, 3 at which no component structures are situated.

In the case of modules it is possible for further component structures (not illustrated here) to be applied on the module substrate 1 directly below the chip 2, 3. Thus, on the module substrate 1, in particular a coil can be arranged below the chip 2, 3 carrying component structures and can be interconnected with said chip. The inductance of said coil can be part of a matching network or of some other circuit which contributes to the function of the chip or the entire module.

In such a case, the gap penetration of the molding compound is chosen in such a way that part of the module substrate 1 which carries component structures is not covered by the molding compound.

Furthermore, an SMD component 9 is applied on the module carrier 1. Said SMD component is connected to the module carrier 1 via solder connections 10, 11. A gap 12 also arises between the SMD component and the module carrier 1. The gap 12 is filled with an underfilling compound. Said underfilling compound can differ from the molding compound with limited gap penetration. Alternatively, the gap is chosen to be larger here.

Figure 3:
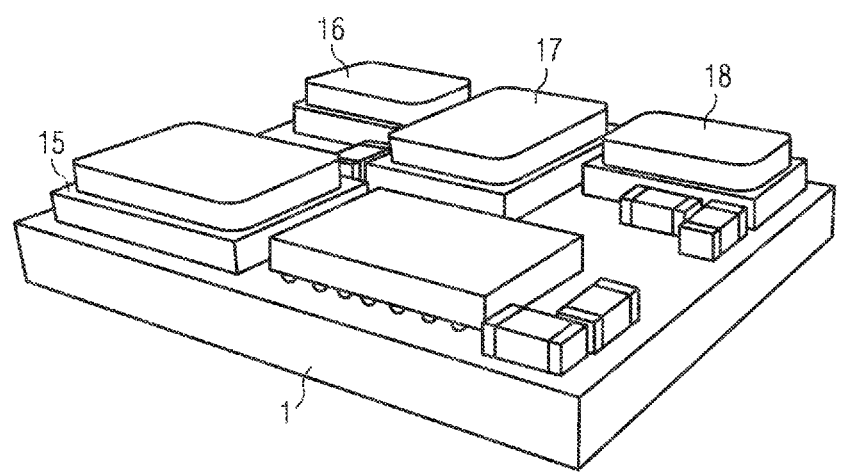
FIG. 3 shows a module known from the prior art in perspective view.

FIG. 3 shows a module package known from the prior art. In this case, a module carrier 1 is populated with various components 15, 16, 17, 18. The components 15-18 are in this case SAW filters. In the module shown in FIG. 3, said SAW filters are in each case incorporated into a housing. As a result, the required height of the module is greater than in the case of the invention.

Figure 2:
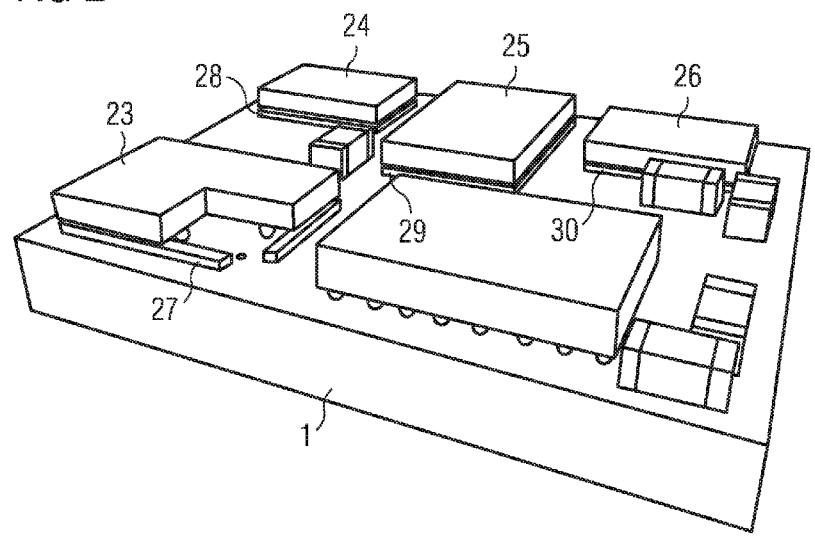
FIG. 2 shows a module without an encapsulation layer according to the present invention.

By contrast, FIG. 2 shows a module according to the present invention, wherein the components 23 to 26 are applied on a module carrier 1. Here the SAW filters 23 to 26 are mounted using the flip-chip method, such that the component structures are situated on the chip side facing the module carrier 1. A gap 4, 5 is formed between the chip top side with component structures and the module carrier 1. Said gap is additionally narrowed by the supporting structures 27, 28, 29, 30. Said supporting structures 27 to 30, fitted e.g. on the module carrier 1, are polymer structures, in particular. Supporting structures 27-30 composed of other materials are also possible, for example composed of metal such as e.g. copper. Furthermore, such supporting structures can also be fitted to the chip itself, such that they narrow the gap 4, 5.

It is also possible to narrow the gap between chip top side and module carrier by bumps. In this case, bumps are formed on the module carrier 1 and produce electrical connections between chip and module carrier. Said bumps are positioned in such a way that they narrow the gap and thus ensure that the encapsulation layer extends less deeply into said gap or that the molding compound penetrates less deeply into said gap during encapsulation. The gap penetration of the molding compound can also be adapted to a narrowed gap. This has the advantage that the encapsulation layer is then simpler to apply and the risk of cavities arising or remaining in the encapsulation layer—apart from the gap to be kept free—is minimized.

LIST OF REFERENCE SIGNS

1 Module substrate
2 Chip
3 Chip
4 Gap
5 Gap
6 Bump
7 Bump
8 Encapsulation layer
9 SMD component 10 Soldering connection
11 Soldering connection
12 Gap
13 Top side of the chip 2
14 Top side of the chip 3
15 Component
16 Component
17 Component
18 Component
23 Component
25 Component
26 Component
27 Supporting structure
28 Supporting structure
29 Supporting structure
30 Supporting structure

The invention claimed is:

1. A module package comprising:
a module substrate;
at least one chip which has component structures on its top side and the top side of which faces the module substrate, wherein a gap is formed between the chip top side and the module substrate; and
an encapsulation layer comprising a molding material with which a filler is admixed,
wherein the encapsulation layer only partly underfills the chip,
wherein as a maximum the part of the chip on which no component structures are situated is underfilled, and as a minimum the encapsulation layer terminates virtually flush with the side areas of the chip, and
wherein the filler has a particle size distribution in which at least one third of the filler particles have a diameter greater than the height of the gap between the chip top side and the module substrate.

2. The module package according to claim 1, wherein the filler forms at least 75 percent by mass of the encapsulation layer.

3. The module package according to claim 1, wherein the filler comprises silicon oxide.

4. The module package according to claim 1, wherein the module substrate or chip has a supporting structure that narrows the gap between the chip and the module substrate.

5. The module package according to claim 1, wherein at least one further component is applied on the module substrate, wherein a gap between the component and the module substrate is completely sealed with a filling compound.

6. The module package according to claim 1, wherein the at least one chip comprises a SAW filter mounted using the flip-chip method.

7. A module package comprising:
a module substrate;
at least one chip which has component structures on its top side and the top side of which faces the module substrate, wherein a gap is formed between the chip top side and the module substrate; and
an encapsulation layer comprising a molding material with which a filler is admixed,
wherein the encapsulation layer only partly underfills the chip, wherein as a maximum the part of the chip on which no component structures are situated is underfilled, and as a minimum the encapsulation layer terminates virtually flush with the side areas of the chip,
wherein the filler has a particle size distribution in which at least one third of the filler particles have a diameter greater than the height of the gap between the chip top side and the module substrate, and
wherein the filler particles have angular outer surfaces.

8. A method for producing a module,
wherein a module carrier with at least one chip having component structures on its top side is populated in such a way that the top side of the chip faces the module carrier and a gap is formed between the chip top side and the module carrier,
wherein a molding compound, comprising a molding material with which a filler is admixed, is applied to at least one part of the module over a large area,
wherein the molding compound is cured to form an encapsulation layer,
wherein the material of the molding compound is selected in such a way that it has a gap penetration that leads to only partly underfilling of the at least one chip in such a way that as a maximum the part of the chip on which no component structures are situated is underfilled, and as a minimum the encapsulation layer terminates virtually flush with the side areas of the chip, and
wherein the filler has a particle size distribution in which at least one third of the filler particles have a diameter greater than the height of the gap between the chip top side and the module carrier.

9. The method according to claim 8, wherein further components are applied on the module carrier, wherein a gap between the component and the module carrier is sealed with a filling compound.

10. The method according to claim 8, wherein the molding compound is solidified thermally or by irradiation.

11. A method for producing a module,
wherein a module carrier with at least one chip having component structures on its top side is populated in such a way that the top side of the chip faces the module carrier and a gap is formed between the chip top side and the module carrier,
wherein a molding compound, comprising a molding material with which a filler is admixed, is applied to at least one part of the module over a large area,
wherein the molding compound is cured to form an encapsulation layer,
wherein the material of the molding compound is selected in such a way that it has a gap penetration that leads to only partly underfilling of the at least one chip in such a way that as a maximum the part of the chip on which no component structures are situated is underfilled, and as a minimum the encapsulation layer terminates virtually flush with the side areas of the chip,
wherein the filler has a particle size distribution in which at least one third of the filler particles have a diameter greater than the height of the gap between the chip top side and the module carrier, and
wherein temperature and pressure are chosen during method in such a way that a minimum viscosity of the molding compound is not undershot.

* * * * *